Figure 1:
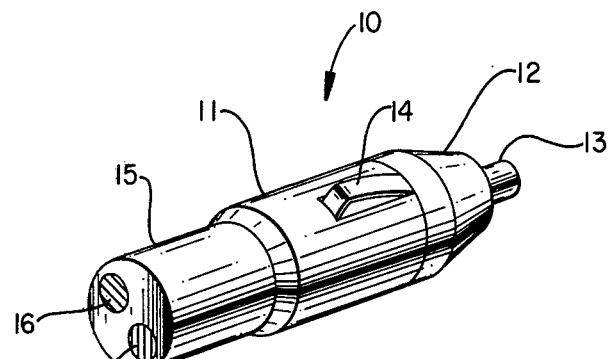

United States Patent [19]

Haley

[11] 4,163,186

[45] Jul. 31, 1979

[54] BATTERY STATE-OF-CHARGE INDICATOR

[76] Inventor: William E. Haley, 1430 Francis La., Plano, Tex. 75040

[21] Appl. No.: 839,929

[22] Filed: Oct. 6, 1977

[51] Int. Cl.$^2$ ............................................. G08B 21/00
[52] U.S. Cl. ......................................... 320/48; 320/2; 340/636
[58] Field of Search ......................................... 320/2–5, 320/48, 43; 340/636

[56] References Cited

U.S. PATENT DOCUMENTS

| | | | |
|---|---|---|---|
| 3,832,629 | 8/1974 | Cernek, Jr. ...................... | 340/636 X |
| 3,921,064 | 11/1975 | Mori et al. ............................ | 320/48 |

OTHER PUBLICATIONS

*Electronic Design*, vol. 19, Sep. 13, 1974, p. 176, "Voltage Monitor Uses LED Indicators . . .," Moss.
*Radio and Electronics Constructor*, vol. 30, Feb. 1977, Jones, "Car Battery Monitor," pp. 425–427.
*Popular Mechanics*, Oct. 1977, Sandler, "Don't Electrocute Your Car Battery," pp. 68, 70, 190.

*Primary Examiner*—Robert J. Hickey
*Attorney, Agent, or Firm*—Warren H. Kintzinger

[57] ABSTRACT

A state-of-charge indicator, powered by a battery to be monitored, compares a reference voltage level developed from the battery and a voltage proportional to that of the battery in a differential-type circuit employing a pair of transistors with common emitter load and each having a collector current activated annunciator; with a first annunciator being activated under conditions of battery voltage definitive of a "good" battery, both annunciators being activated for lower battery voltage indicative of a failing trend, only the second annunciator being activated for still lower battery voltage indicative of a "bad" battery, and neither annunciator being activated for still lower battery voltage indicative of a failed condition. The minimal current drain device is not adversely effected by voltage drop in wiring runs to the monitored battery, and may be self-contained within a plug-in unit for insertion into a vehicle cigarette lighter receptacle, or dashboard mounted, with non-critical length wiring run to the vehicle battery.

15 Claims, 2 Drawing Figures

BATTERY STATE-OF-CHARGE INDICATOR

This invention relates in general to monitoring devices, and in particular, to a device which monitors the state-of-charge of a lead cell battery and provides a visual indication of the state-of-charge.

Electrical system monitoring devices presently used in automobiles are generally related to displaying the generator or alternator charging activity. Generator or voltage regulator failures, for example, cause an indication of battery discharge either via an ammeter or "idiot light" indicating means. These monitoring means, however, are not directed to indication of the condition of the battery, i.e., the battery state-of-charge, and only serve to announce that the battery is being discharged, and that the automobile is being "driven off the battery". The state-of-charge of a battery is determinable by measuring the specific gravity thereof, which, in turn, is related to the voltage appearing across the battery terminals, which activities are generally performed by service station personnel.

The ammeter or "idiot light" in todays automobile thus indicates that the battery is being charged or discharged, but does not provide an indication of whether the battery is good or bad as to its instant capacity (state-of-charge). A bad battery will not take a full charge, and without benefit of any currently provided warning, the next "start" of an automobile may be the last.

It is, therefore, a principal object of this invention to provide a small, low cost device which monitors the state-of-charge of a lead cell battery via a measurement of the "no-load" (open circuit) battery voltage, and provides a visual indication that the battery is "good", "going bad", or "bad" based on the instant state-of-charge of the battery.

Another object is to provide such a device in the form of a self-contained indicator which may simply be wired across the terminals of a battery, with the indicator being locatable conveniently in or on the automobile instrument panel.

A further object is to provide an indicator which is powered by the battery under surveilance and which effects a minimal current drain on the battery so as not to be adversely influenced by voltage drops due to wiring runs.

A still further object for such an indicator is the provision of means automatically adjusting the indicator threshold to require a proportionally higher voltage for a "good" battery indication as ambient temperature decreases.

Features of this invention useful in accomplishing the above objects include, in a battery state-of-charge indicator, a differential amplifier means with supply and bias means effected by the voltage of a battery under test. A pair of transistors with a common load are employed. The input to one section of the differential amplifier is a reference potential which is developed for any battery terminal voltage in excess of the reference potential, while the other section of the differential amplifier is provided with an input which is proportional to the battery terminal voltage. Each amplifier section is provided with a light emitting diode which is energized by current flow in that section. The respective reference-voltage and battery-voltage-proportional inputs to the differential amplifier are selected such that one of the light emitting diodes is "on" for battery terminal voltages in a range corresponding to a fully charged "good" battery; both light emitting diodes are "on" for battery voltage in a range beneath the predefined "good" range, indicating that the battery is in a failing condition; and only the second light emitting diode is on for battery voltages in a still lower range deemed "bad". For still lower battery voltages, neither of the diodes is on—indicating battery failure. Conventional LED colors may be employed, i.e., green for "good" and red for "bad". In a particular embodiment, the indicator is housed in a cigarette lighter type package, with connection to the battery made by insertion into a standard instrument panel lighter socket.

A specific embodiment representing what is presently regarded as the best mode of carrying out the invention is illustrated in the accompanying drawing.

Figure 2:
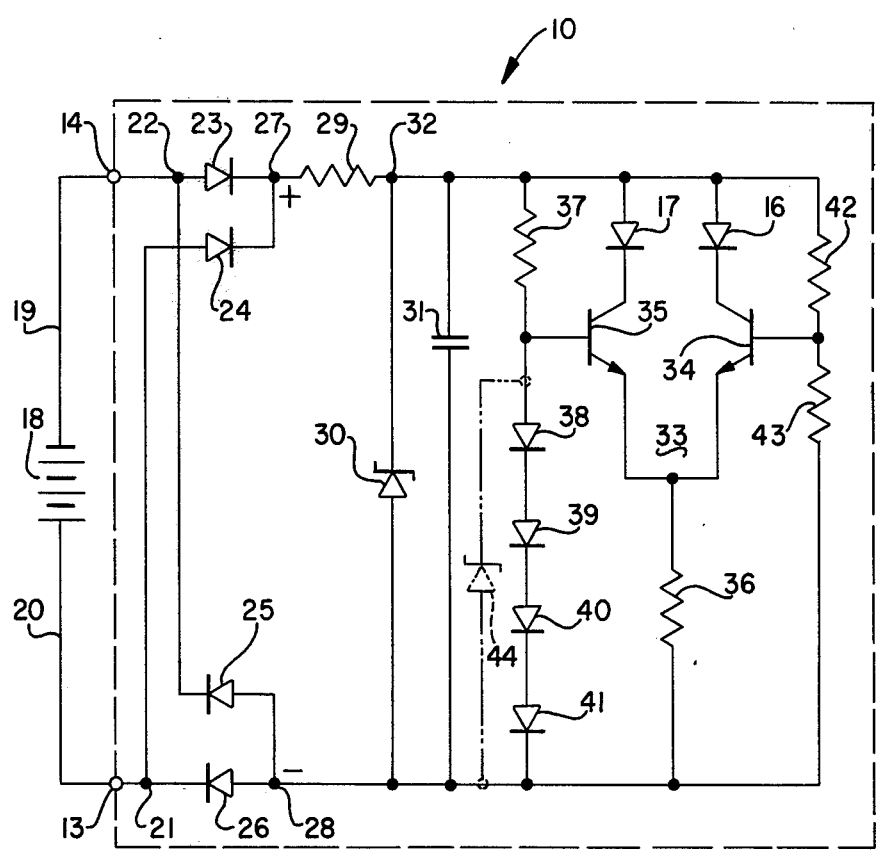

In the drawing:

FIG. 1 represents a cigarette lighter type package for housing the indicator and providing battery terminal connection thereto; and FIG. 2, a schematic diagram of the indicator circuitry.

Referring to the drawing:

The indicator 10 of FIG. 1 as shown in the form of a unitary package which may be inserted into a cigarette lighter receptacle for connection to vehicle battery terminals via the receptacle wiring run. The indicator 10 comprises a cylindrical central body portion 11 terminated by a tapered cylindrical end portion 12 through which extends a spring loaded contact pin 13. The central body portion 11 is provided with an opening through which a leaf-like spring contact member 14 extends. The indicator 10 may thus be connected to vehicle battery terminals via contact members 13 and 14 when inserted in a cigarette lighter receptacle. The outer end 15 of the body member is provided with appropriate openings through which a green light emitting diode 16 and a red light emitting diode 17 are viewable. The housing of FIG. 1 may thus be comparable in shape and size to standard cigarette lighters and the electronic circuitry comprising the indicator may be packaged therein so as to be a self-contained device readily connectable to a vehicle battery through in-place wiring runs to a cigarette lighter receptacle. The indicator circuitry, to be described is readily packageable within the confines of a package such as shown in FIG. 1.

With reference now to FIG. 2, wherein the indicator circuitry is schematically shown, the indicator 10 is shown with external contact members 13 and 14 connected to a battery 18 by respective leads 19 and 20, which might comprise the existing wiring run between a lighter socket and an automobile battery as above described. Contact members 13 and 14 are connected to the input junction-pair 21-22 of a full wave diode bridge comprised of diode members 23-26. The battery terminal voltage thus appears at the bridge output junction-pair 27-28 with polarities as indicated, the purpose of the bridge being to render the indicator operative with both negative and positive ground systems, and thereby provide polarity protection.

Bridge junction 27 is connected through a resistor 29, and zener diode 30 to junction 28, with zener diode 30 shunted by a capacitor 31. Resistor 29, zener diode 30, and capacitor 31 provide protection against transients which are normally present in automobile electrical systems, with zener diode 30 having a breakdown voltage in excess of the normal voltage of battery 18, for example, a 15–18 volt zener diode in conjunction with a 12-volt battery. As concerns the actual voltage sensing circuit of the indicator, the junction 32 between resistor 29, zener diode 30 and capacitor 31 comprises a first input terminal, and the diode bridge output junction 28 comprises a second input terminal.

The sensing circuitry operates on a comparison between a voltage proportional to the battery voltage, as it appears across the first and second input terminals 32 and 28, with a reference voltage level. The comparison circuitry 33 comprises a pair of transistors 34 and 35 with respective emitters connected through a common load resistor 36 to the second input terminal 28. The collectors of transistors 34 and 35 are respectively connected through associated ones of light emitting diodes 16 and 17 to the first input terminal 32 of the sensing circuitry. A current limiting resistor 37 and diodes 38–41 are respectively serially connected between terminals 32 and 28, such that the diodes 38–41 are forward biased by the applied voltage and a predetermined forward biased diode reference drop is exhibited collectively by the diode members to thereby establish a base reference potential for the base of transistor 35.

A pair of resistors 42 and 43 are respectively serially connected between input terminals 32 and 28, with the junction between these transistors connected to the base of transistor 34. Resistors 42 and 43 thus form a voltage dividing network to apply a base voltage to transistor 34 which is a predetermined function of the voltage across input terminals 32 and 28. Thus, the base-emitter junction of transistor 34 is biased as the differential between the battery output proportional voltage appearing at the junction between resistors 42 and 43 and the voltage drop across common emitter load resistor 36. The base emitter junction of transistor 35 is biased as the differential between the fixed reference voltage established by forward biased diodes 38–41 and the voltage drop across common emitter load resistor 36. Now, the battery voltage proportional and reference inputs to the respective transistors 34 and 35 may be selected (number of diodes in the serially interconnected reference circuit and respective values of voltage divider resistors 42 and 43, such that one or the other, both, or neither of the transistors is conducting to energize its associated light emitting diode, to provide visual annunciation that the battery voltage is indicative of a good, bad, going bad, or failed battery condition. For purposes of the invention, light emitting diode 16 is the "good" indicator and might be green, in color, while diode 17 is the "bad" indicator and might be red in color.

In operation, the voltage divider 42–43 provides an input to the base of transistor 34 which is a function of the voltage appearing between input terminals 32 and 28, which is a voltage equal to the applied battery voltage minus two diode forward voltage drops (bridge diodes 24 and 25 for the battery polarity indicated) minus the drop across resistor 29. As long as the voltage at the base of transistor 34 exceeds the reference voltage at the base of transistor 35, transistor 34 is turned on, holding transistor 35 off. Light emitting diode 16 in the collector circuit of transistor 34 is turned on to indicate "good" battery condition. As the battery voltage drops from the level defining a "good" condition, transistor 35 starts to come on to turn on light emitting diode 17 as well as diode 16; and when the battery voltage drops sufficiently lower that the base voltage of transistor 34 is less than the voltage drop across load resistor 36, transistor 34 will turn off. Transistor 35 will then remain on as will the "bad" indicator, diode 17. Since the base voltage of transistor 35 is fixed by the collective forward drops of diodes 38–41, transistor 35 and load resistor 36 will now act as a fairly rubbery constant current sink, and this characteristic will keep the "bad" light emitting diode 17 at essentially constant brillance until the battery voltage falls below that required to establish the collective forward drops of the reference voltage diode-chain, whereupon both light emitting diodes are off to indicate a failed battery condition.

The reference potential on the base of transistor 35 has been defined as being established by the collective forward-biased voltage drops of serially interconnected diode members 38–41. As indicated in phantom line in FIG. 2, the serially interconnected diode string 38–41 might be replaced by a single low voltage zener diode 44, with operation of the indicator at "room ambient" temperature being essentially the same. The plural diodes are preferred, however, since the forward diode drops have a predictable negative temperature characteristic which advantageously causes the "bad" threshold voltage, as established by the reference potential on the base of transistor 35, to move up with decreasing ambient temperature. This is desirable since a better battery is required to start an automobile engine in cold weather, and the battery condition indicator effectively "raises its standard" as ambient temperature decreases.

Uniquely, the battery condition indicator as herein described, is useful in detecting not only a low state-of-charge of the battery, but, under battery load conditions, will detect high voltage drops at the battery post connections as well as bad battery ground connections. The indicator is seen to provide early warning of bad battery charge conditions caused by faulty charging circuits or equipment. A shorted battery cell can readily be detected due to the attendant reduced voltage at the battery terminals. The unit is seen to be advantageously self-contained and independent of any power source other than that provided by the battery which it monitors.

It might be noted that the state-of-charge indicator described herein may be modified, by appropriate component value changes and reference level potential to be useful with six, twelve and twenty-four volt lead acid systems and in any case, would impose a minimal current drain on the power source. In the illustrated embodiment, NPN transistors are employed towards minimizing power consumption, however, it is to be realized that PNP transistors might be employed with reversal of applied battery potential and appropriate reversal of the light-emitting diodes, reference voltage diodes and zener diode members in the circuit herein described.

Thus, whereas this invention is herein illustrated and described with respect to a particular embodiment thereof, it should be realized that various changes may be made without departing from essential contributions to the art made by the teachings hereof.

I claim:

1. A state-of-charge indicator for a battery comprising: a pair of current flow activated indicator means, first terminal means and second terminal means, a pair of transistors with collector elements serially connected through respective indicator means of said pair of current flow activated indicator means to said first terminal means, a common resistive member connected to the emitter elements of said pair of transistors with each transistor connected through said common resistive member to said second terminal means, first means biasing the base-emitter junction of said first transistor as the differential between a fixed reference potential and the voltage drop across said common resistive member, and second means biasing the base-emitter junction of said second transistor as the differential between a potential defined as a predetermined function of the voltage across said terminal means and the voltage drop across said common resistive member, and means for connecting said first and second terminal means to respective battery terminals.

2. The indicator of claim 1 with said predetermined function being a predetermined fractional part of the voltage across said first and second terminal means.

3. The indicator of claim 2, with said second biasing means comprising a resistive voltage divider network connected across said first and second terminal means, with said base element of said second transistor connected to the output tap of said voltage divider network.

4. The indicator of claim 3, with a zener diode connected across said first and second terminal means to be reverse biased thereby, and said reference potential comprising the voltage across respective terminals of said zener diode.

5. The indicator of claim 3, with diode means connected across said first and second terminal means to be forward biased thereby, and said fixed reference potential comprising the forward biased voltage-drop across said diode means.

6. The indicator of claim 5, with said diode means comprising a plurality of like-polarized serially interconnected diode members collectively effecting said fixed reference potential.

7. The indicator of claim 6, with said first and second terminal means being connected to the output junction-pair of a full wave diode bridge means, and the input junction-pair of said bridge being connectable to said battery terminals.

8. The indicator of claim 7, with low pass filter means including a capacitor member connected across said bridge output junction-pair, with the respective terminals of said capacitor comprising said first and second terminal means.

9. The indicator of claim 8, with voltage limiting means connected across said first and second terminal means and operative to limit transient voltages as may appear thereacross to a predetermined maximum value in excess of the nominal output voltage level of a battery to which said indicator is connected.

10. The indicator of claim 8, with said current-flow activated indicating means comprising respective light emitting diodes.

11. The indicator of claim 1, with said respective means for biasing the base-emitter junctions of said first and second transistors effecting condition of second transistor for battery terminal defined potentials equalling and falling within a predetermined range below the fully charged output voltage of said battery, and effecting exclusive conduction of said first transistor for battery terminal means defined below a predetermined minimum level below said fully charged voltage, and effecting a lesser conduction of both said transistors for battery defined potential between said predetermined range and said predetermined minimum level.

12. The indicator of claim 11, with said first and second terminal means being connected to the output junction-pair of a full wave diode bridge means, and the input junction-pair of said bridge being connectable to said battery terminals.

13. The indicator of claim 12, with low pass filter means including a capacitor member connected across said bridge output junction-pair, with the respective terminals of said capacitor comprising said first and second terminal means.

14. The indicator of claim 13, with voltage limiting means connected across said first and second terminal means and operative to limit transient voltages as may appear thereacross to a predetermined maximum value in excess of the nominal output voltage level of a battery to which said indicator is connected.

15. The indicator of claim 13, with said current-flow activated indicating means comprising respective light emitting diodes.

* * * * *